United States Patent
Derderian et al.

(10) Patent No.: US 6,787,477 B2
(45) Date of Patent: Sep. 7, 2004

(54) METHODS OF FORMING DIELECTRIC LAYERS AND METHODS OF FORMING CAPACITORS

(75) Inventors: Garo J. Derderian, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 37 days.

(21) Appl. No.: 09/962,472

(22) Filed: Sep. 24, 2001

(65) Prior Publication Data

US 2002/0009848 A1 Jan. 24, 2002

Related U.S. Application Data

(63) Continuation of application No. 09/670,984, filed on Sep. 26, 2000, now Pat. No. 6,319,856, which is a continuation of application No. 09/032,765, filed on Feb. 28, 1998, now Pat. No. 6,147,011.

(51) Int. Cl.[7] ............................................. H01L 21/31
(52) U.S. Cl. .................... 438/758; 438/778; 438/783; 438/784
(58) Field of Search ................................ 438/758, 783, 438/784, 785, 778

(56) References Cited

U.S. PATENT DOCUMENTS

| | | | |
|---|---|---|---|
| 4,918,028 A | * 4/1990 | Shirai | 437/81 |
| 5,043,224 A | 8/1991 | Jaccodine et al. | 428/446 |
| 5,180,435 A | 1/1993 | Markunas et al. | 118/723 |
| 5,264,396 A | 11/1993 | Thakur et al. | 437/238 |
| 5,360,769 A | 11/1994 | Thakur et al. | 437/239 |
| 5,397,720 A | 3/1995 | Kwong et al. | 437/40 |
| 5,539,154 A | * 7/1996 | Nguyen et al. | 174/138 C |

(List continued on next page.)

FOREIGN PATENT DOCUMENTS

| | | |
|---|---|---|
| JP | 62-92328 | 4/1987 |
| JP | 05198573 | 8/1993 |
| JP | 5198574 | 8/1993 |
| JP | 5343421 | 12/1993 |
| WO | 92/20833 | 11/1992 |

OTHER PUBLICATIONS

R.V. Giridhar et al., "$SF_6$ Enhanced Nitridation of Silicon in Active Nitrogen", Appl. Phys. Lett. 45(5), Sep. 1, 1984, pp. 578–580.

M. Morita, et al., "Low–temperature $SiO_2$ growth using fluorine–enhanced thermal oxidation", Appl. Phys. Lett. 47(3), Aug. 1, 1985, pp. 253–255.

(List continued on next page.)

Primary Examiner—Hsien Ming Lee
(74) Attorney, Agent, or Firm—Wells St. John P.S.

(57) ABSTRACT

Methods of forming dielectric layers and methods of forming capacitors are described. In one embodiment, a substrate is placed within a chemical vapor deposition reactor. In the presence of activated fluorine, a dielectric layer is chemical vapor deposited over the substrate and comprises fluorine from the activated fluorine. In another embodiment, a fluorine-comprising material is formed over at least a portion of an internal surface of the reactor. Subsequently, a dielectric layer is chemical vapor deposited over the substrate. During deposition, at least some of the fluorine-comprising material is dislodged from the surface portion and incorporated in the dielectric layer. In another embodiment, the internal surface of the reactor is treated with a gas plasma generated from a source gas comprising fluorine, sufficient to leave some residual fluorine thereover. Subsequently, a substrate is exposed within the reactor to chemical vapor deposition conditions which are effective to form a dielectric layer thereover comprising fluorine from the residual fluorine.

35 Claims, 4 Drawing Sheets

U.S. PATENT DOCUMENTS

| | | | | |
|---|---|---|---|---|
| 5,541,141 A | | 7/1996 | Cho | 437/239 |
| 5,552,337 A | | 9/1996 | Kwon et al. | 437/60 |
| 5,629,246 A | * | 5/1997 | Iyer | 438/763 |
| 5,674,788 A | | 10/1997 | Wristers et al. | 437/239 |
| 5,712,208 A | | 1/1998 | Tseng et al. | 438/770 |
| 5,738,909 A | | 4/1998 | Thakur et al. | 427/255.4 |
| 5,763,021 A | | 6/1998 | Young et al. | 427/579 |
| 6,147,011 A | | 11/2000 | Derderian et al. | |
| 6,319,856 B1 | * | 11/2001 | Derderian et al. | 438/783 |

OTHER PUBLICATIONS

M. Morita et al., "A New $SiO_2$ Growth By Fluorine–Enhanced Thermal Oxidation", IEDM 1984, pp. 144–147.

Wolf, Stanley, *Silicon Processing for the VLSI Era*, vol. 3, pp. 654–658, 1995.

Ting, W. et al., Appl. Phys. Lett., 57 (26), pp 2808–2810, Dec. 24, 1990, 1990.

Sun, S.C. et al., Mat. Res. Soc. Symp. Proc. vol. 387, 1995 Materials Research Society, pp. 241–245.

* cited by examiner

METHODS OF FORMING DIELECTRIC LAYERS AND METHODS OF FORMING CAPACITORS

RELATED PATENT DATA

This patent application is a continuation of U.S. patent application Ser. No. 09/670,984, filed on Sep. 26, 2000, entitled "Methods of Forming Dielectric Layers and Methods of Forming Capacitors", naming Garo Derderian and Gurtej S. Sandhu as inventors, now U.S. Pat. No. 6,319,856, the disclosure of which is incorporated by reference; which is a continuation of U.S. patent application Ser. No. 09/032,765, filed on Feb. 28, 1998, entitled "Methods of Forming Dielectric Layers and Methods of Forming Capacitors", naming Garo Derderian and Gurtej S. Sandhu as inventors, now U.S. Pat. No. 6,147,011, the disclosure of which is incorporated by reference.

TECHNICAL FIELD

This invention relates to methods of forming dielectric layers and to methods of forming capacitors.

BACKGROUND OF THE INVENTION

Dielectric material layers are essential components in integrated circuitry capacitors, and are typically interposed between two capacitor plates. Capacitors are used in memory circuits, such as dynamic random access memory (DRAM) arrays.

As device dimensions continue to shrink, an important emphasis is placed on maintaining, and in some instances, increasing a capacitor's ability to store a desirable charge. For example, a capacitor's charge storage capability can be increased by making the capacitor dielectric thinner, by using an insulator with a larger dielectric constant, or by increasing the area of the capacitor. Increasing the area of a capacitor is undesirable because the industry emphasis is on reducing overall device dimensions. On the other hand, providing a thinner capacitor dielectric layer and/or using an insulator with a larger dielectric constant can present problems associated with current leakage, such as that which can be caused by Fowler-Nordheim Tunneling. Current leakage can significantly adversely impact the ability of a capacitor to store a charge.

This invention grew out of needs associated with providing methods of forming dielectric layers having sufficiently high dielectric constants. This invention also grew out of needs associated with providing methods of forming capacitor constructions which have desirable charge storage characteristics, and reduced current leakage.

SUMMARY OF THE INVENTION

Methods of forming dielectric layers and methods of forming capacitors are described. In one embodiment, a substrate is placed within a chemical vapor deposition reactor. In the presence of activated fluorine, a dielectric layer is chemical vapor deposited over the substrate and comprises fluorine from the activated fluorine. In another embodiment, a fluorine-comprising material is formed over at least a portion of an internal surface of the reactor. Subsequently, a dielectric layer is chemical vapor deposited over the substrate. During deposition, at least some of the fluorine-comprising material is dislodged from the surface portion and incorporated in the dielectric layer. In another embodiment, the internal surface of the reactor is treated with a gas plasma generated from a source gas comprising fluorine, sufficient to leave some residual fluorine thereover. Subsequently, a substrate is exposed within the reactor to chemical vapor deposition conditions which are effective to form a dielectric layer thereover comprising fluorine from the residual fluorine.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
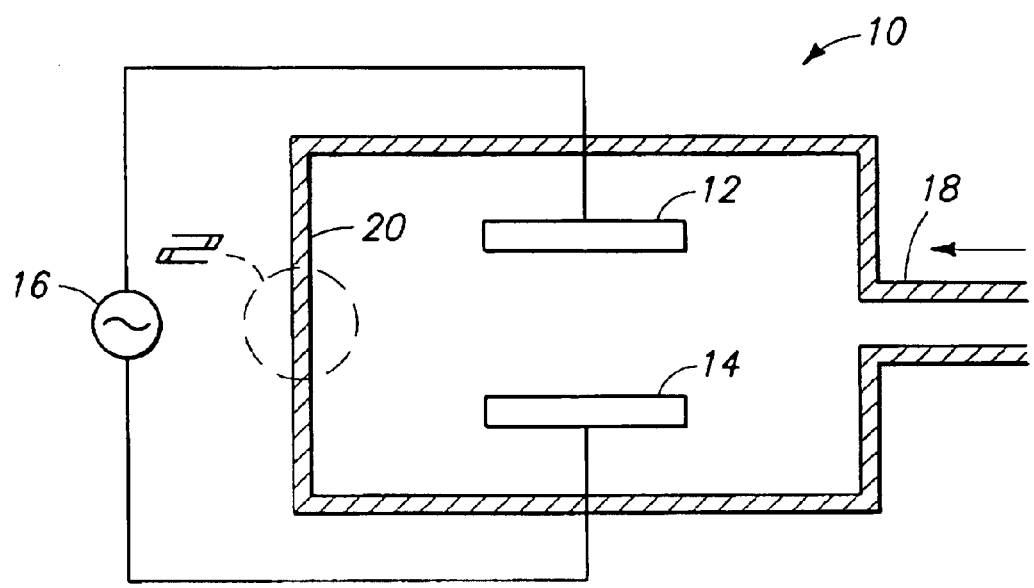
FIG. 1 is a schematic diagram of a chemical vapor deposition reactor in accordance with one aspect of the invention.

Referring to FIG. 1, a chemical vapor deposition reactor is shown generally at 10. Reactor 10 can comprise any suitable reactor which is capable of processing substrates as described below. The illustrated reactor includes a pair of electrodes 12, 14 which can be biased by an RF source 16. RF source 16 can be used, in one implementation, to generate a gas plasma within the reactor. Various other reactor types and designs, some of which can be used in connection with various aspects of the invention, are described in a text by Lieberman and Lichtenberg, entitled *Principles of Plasma Discharges and Materials Processing*, the disclosure of which is incorporated by reference.

Reactor 10 is typically used to chemical vapor deposit various layers over a substrate (not shown) and can include a source 18 through which various precursor gases are provided and processed. Such gases can also be provided through an electrode, such as electrode 12.

Figure 2:
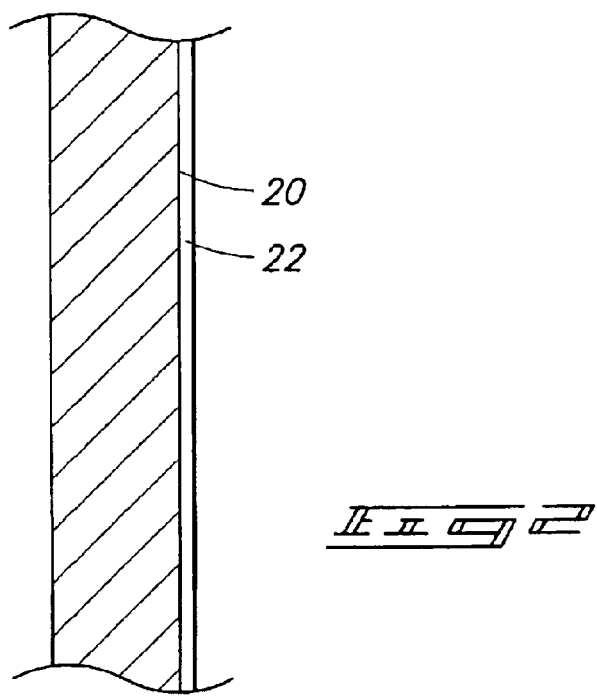
FIG. 2 is a view of a portion of the reactor.
Figure 3:
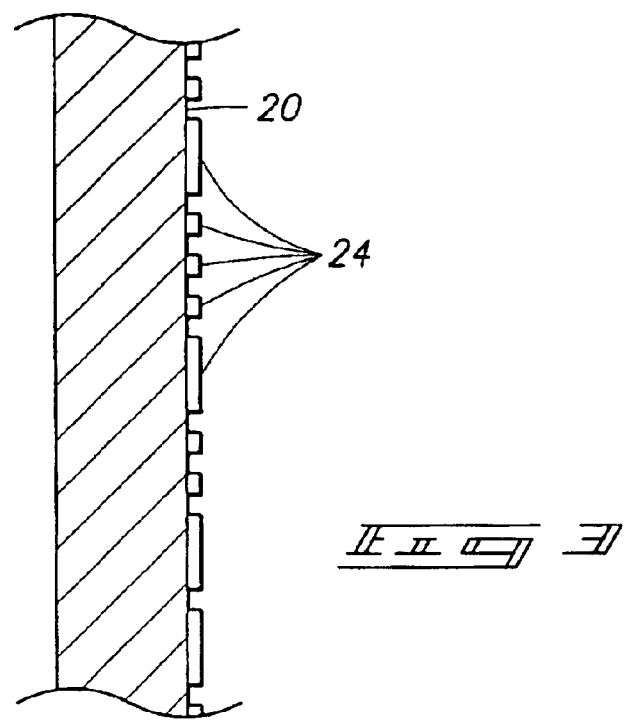
FIG. 3 is a view of a portion of the reactor.

Referring to FIGS. 1–3, reactor 10 includes an internal surface 20 which defines a processing chamber in which processing takes place. The illustrated reactor is depicted at a processing point prior to placement of a substrate therein. A halogen-comprising material, preferably a fluorine-comprising material 22 (FIG. 2), 24 (FIG. 3), is formed over at least a portion of surface 20. In a most preferred aspect, halogen-comprising material comprises activated fluorine. By "activated" is meant that the material can include ions, radicals, electrons, and other excited species having lifetimes which are influenced by various factors.

One way of providing the activated fluorine material 22, 24 is to generate a fluorine-comprising gas plasma having activated fluorine therein. Such plasma can be generated by introducing a fluorine-comprising source gas, such as $NF_3$, into the reactor, and subjecting the source gas to processing conditions which are effective to form the gas plasma. Such processing conditions can include, in the reactor illustrated in FIG. 1, subjecting the source gas to suitable RF energy sufficient to form the plasma. Accordingly, internal surface 20 is treated with the gas plasma prior to introduction of a substrate therein. Such treatment effectively leaves residual activated fluorine over surface 20 in the absence of a substrate. Accordingly in this example, the substrate is not exposed to the gas plasma. Coverage of surface 20 by the activated fluorine can be non-uniform, as shown in FIG. 3. Preferably, at least some of the residual activated fluorine is present during the chemical vapor depositing of a dielectric layer which is described just below.

Figure 4:
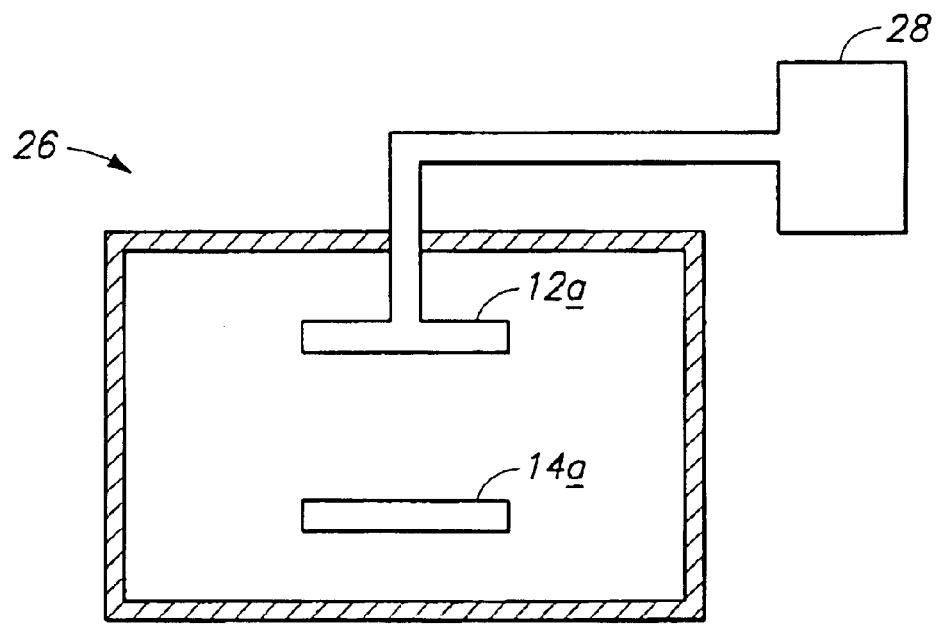
FIG. 4 is a schematic diagram of another reactor in accordance with another aspect of the invention.

In this example, and because the substrate is not present in the reactor during formation of the gas plasma, the gas plasma is formed away from the substrate. Accordingly, the reactor is preferably substantially, if not completely, plasma-free during the depositing of the dielectric layer. By "substantially" is meant that it can be possible, in some reactor types, for plasma to exist in the reactor substantially remote of the substrate. Such is more likely to occur with the reactor design illustrated in FIG. 4. There, a reactor 26 includes a remote plasma source 28 operably coupled therewith. Source 28 is preferably one which is capable of generating a gas plasma, from the fluorine-comprising source gas, which is subsequently flowed into reactor 26. In this way, a gas plasma is formed away from any substrate which might be present in FIG. 4. Remote plasma processing and apparatuses for conducting such processing are described in U.S. Pat. No. 5,180,435, entitled "Remote Plasma Enhanced CVD Method and Apparatus for Growing an Epitaxial Semiconductor Layer", the disclosure of which is incorporated by reference. In the illustrated example, only electrodes 12a, 14a are shown. A substrate is not specifically depicted in the FIG. 4 example. A substrate could, however, be present in reactor 26 during formation of, and subsequent flowing of the activated fluorine from remote plasma source 28.

Figure 5:
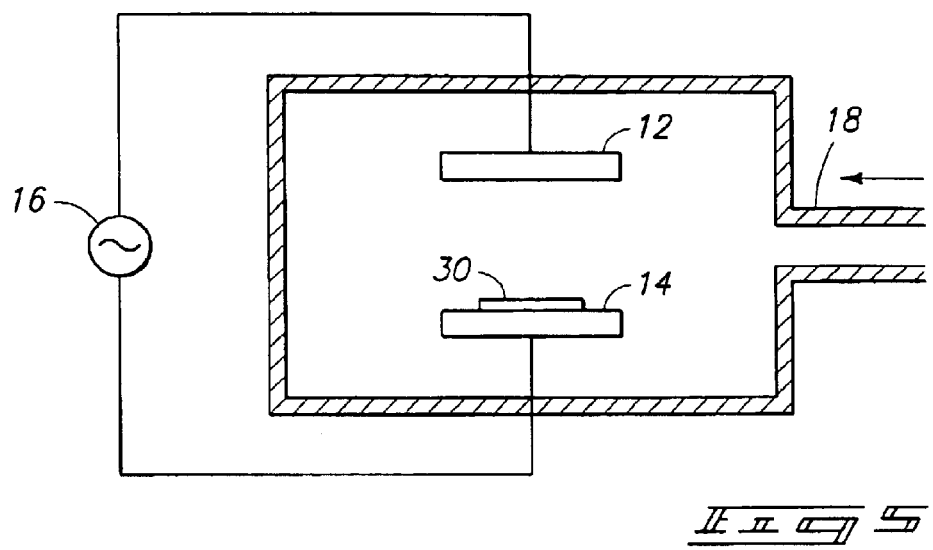
FIG. 5 is a view of the FIG. 1 reactor at a processing step in accordance with one aspect of the invention.

Referring to FIG. 5, a substrate 30 is placed within reactor 10, and preferably after the internal walls of the reactor have been pre-treated with the fluorine-comprising gas plasma. In the presence of activated fluorine within the reactor, the substrate is exposed to conditions which are effective to chemical vapor deposit a dielectric layer over the substrate which comprises fluorine from the activated fluorine. Processing conditions under which dielectric layers can be deposited include using liquid chemical precursors including tantalum pentaethoxide (TAETO) or tantalum tetraethoxide dimethylaminoethoxide (TAT-DMAE), at temperatures from between about 400° C. to 500° C., and pressures from between about 30 mTorr to 30 Torr. Other precursors such as BST precursors, e.g. $M(thd)_2$, where M is either Ba or Sr, at temperatures from between about 500° C. to 650° C., and pressures from between about 30 mTorr to 30 Torr, can be used.

Preferably, the dielectric layer has a dielectric constant or "k" value which is greater than about 6. Exemplary materials for the dielectric layer can include silicon nitride ("k" value of around 7), tantalum pentoxide ($Ta_2O_5$)("k" values ranging from about 10–25), BST ("k" values ranging from about 100 to 1000 or greater). The dielectric layer preferably comprises less than about 10% fluorine, by weight. More preferably, the dielectric layer comprises between about 0.001% and 10% fluorine, by weight.

Figure 6:
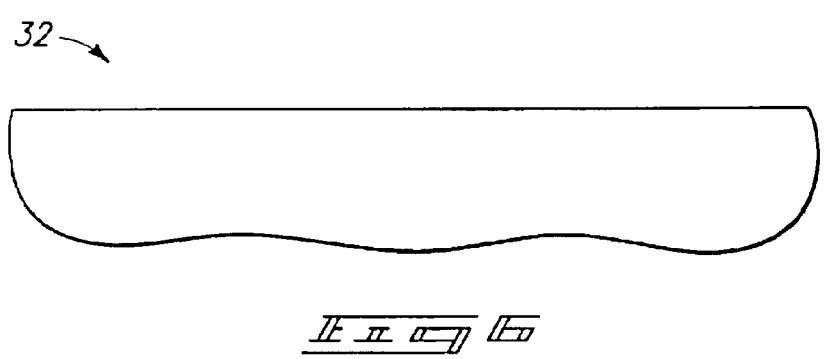
FIG. 6 is a diagrammatic side sectional view of a portion of a wafer fragment, in process, in accordance with one aspect of the invention.
Figure 7:
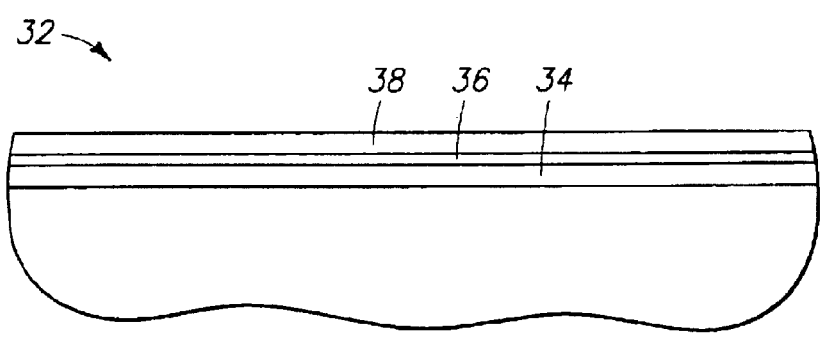
FIG. 7 is a view of the FIG. 6 wafer fragment at a different processing step.

Referring to FIGS. 6 and 7, a capacitor forming method is described relative to a substrate 32. Such can comprise any suitable substrate over which a capacitor is to be formed. An exemplary capacitor formed in connection with dynamic random access memory circuitry includes a substrate comprising insulative materials, such as borophosphosilicate glass. A first capacitor plate 34 is formed over substrate 32, typically, by chemical vapor deposition of polysilicon. In the presence of activated fluorine, as described above, a dielectric layer 36 is chemical vapor deposited over first capacitor plate layer 34. A second capacitor plate layer 38 is formed over dielectric layer 36 to provide a capacitor construction.

In one reduction-to-practice example, an Applied Materials 5000 processing chamber was cleaned, prior to introduction of a substrate therein, with a remote $NF_3$ plasma under the following processing conditions: 1500 sccm of $NF_3$, 1800–3200 watts at around 2 Torr for a duration of about 100 seconds. After the plasma clean, a semiconductor wafer was placed in the chamber and a dielectric layer, such as those layers described above, was formed over the wafer. The following conditions were used: temperature of around 475° C. with 300 sccm TAT-DMAE, 250 sccm of $O_2$, spacing of 350 mils, and a pressure of 1 Torr.

Figure 8:
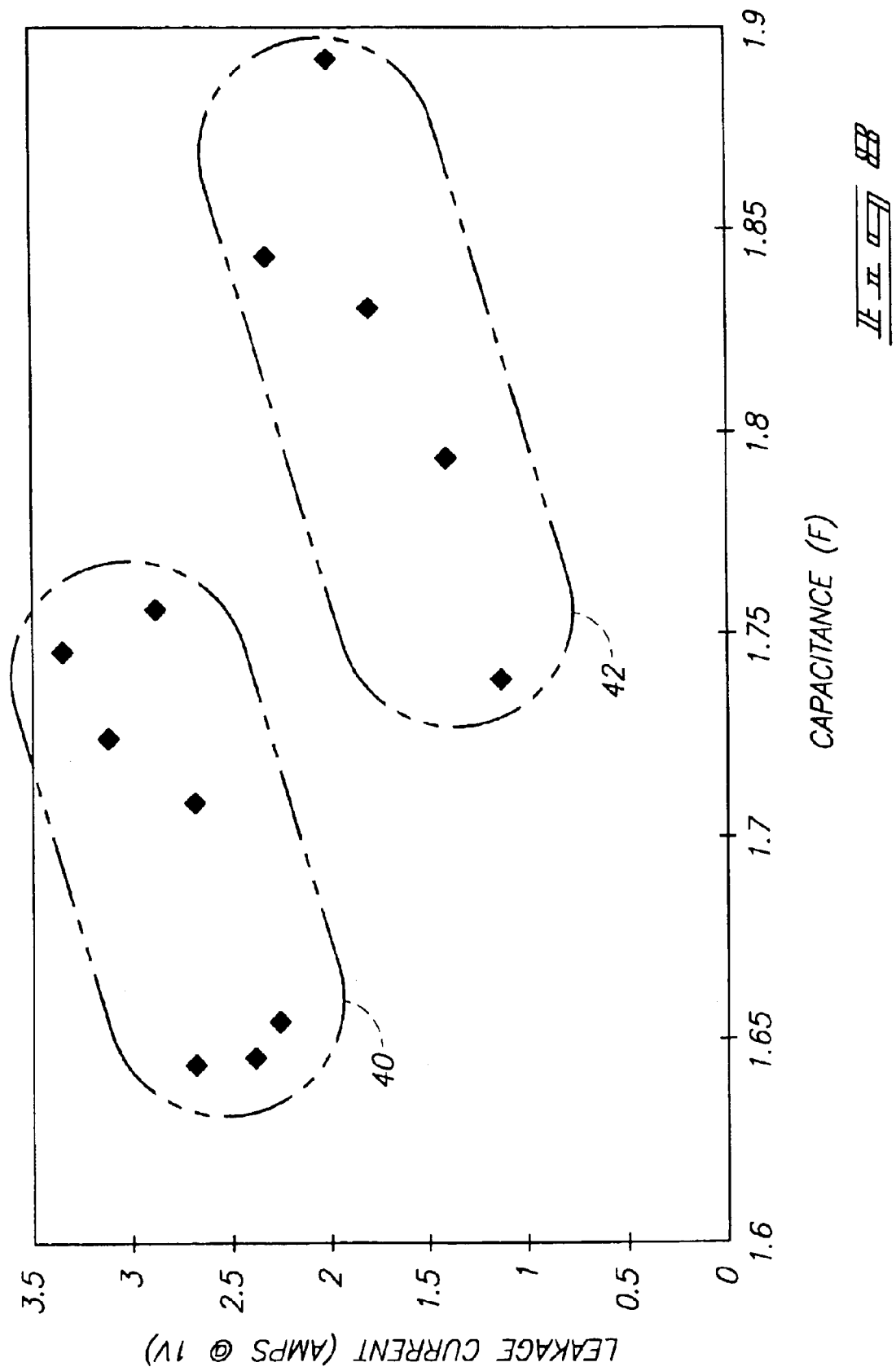
FIG. 8 is a graph of capacitance versus leakage current.

FIG. 8 illustrates, for the reduction-to-practice example, a graph of capacitance versus leakage current for two areas over the wafer. Data points, collectively grouped at 40, correspond to capacitance and leakage current measurements taken at or near the center of the wafer. Data points, collectively grouped at 42, correspond to capacitance and leakage current measurements taken at or near the edge of the wafer. As a consequence of the chamber geometry of the Applied Materials 5000 chamber, more residual fluorine-comprising material (e.g. activated fluorine), is prevalent at the edge of the wafer. Hence, the edge of the wafer is more influenced by the above-described treatment than other wafer portions such as those at or near the center of the wafer. Plotting capacitance versus leakage for the two areas indicates that the capacitance achieved at or near the edge of the wafer (i.e., corresponding to data points 42) is generally greater than the capacitance at or near the center of the wafer (i.e., corresponding to data points 40). In addition, data points 42 constitute wafer areas generally having less leakage current for a given capacitance than those defined by data points 40. Accordingly, for some of the data points, an overall increase in capacitance was observed with a lowering of the leakage current. In addition, the deposition rate of the dielectric layer was observed to increase in the presence of the residual activated fluorine.

Accordingly, the methods described above permit dielectric layers having increased dielectric constants to be formed. Such permits capacitors having reduced dimensions to be formed with desirable charge storage characteristics.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a dielectric layer comprising:
    forming a fluorine-comprising material over at least an interior surface portion of a chemical vapor deposition reactor; and
    chemical vapor depositing a dielectric layer within the reactor and dislodging at least some of the fluorine-comprising material from the interior surface portion to incorporate at least some fluorine of the fluorine-comprising material in the dielectric layer.

2. The method of claim 1, wherein forming the fluorine-comprising material comprises forming activated fluorine over the interior surface portion.

3. The method of claim 1, wherein forming the fluorine-comprising material comprises generating a fluorine-comprising gas plasma having activated fluorine therein which is formed over the interior surface portion.

4. The method of claim 1, wherein forming the fluorine-comprising material comprises generating a fluorine-comprising gas plasma remote from the chemical vapor deposition reactor, the gas plasma having activated fluorine therein, and providing at least some of the activated fluorine from the gas plasma over the interior surface portion.

5. The method of claim 1, wherein forming the fluorine-comprising material comprises generating a gas plasma from a source gas comprising $NF_3$, the plasma having activated fluorine therein which is formed over the interior surface portion.

6. The method of claim 1, wherein forming the fluorine-comprising material comprises generating a gas plasma from a source gas consisting of $NF_3$, the plasma having activated fluorine therein which is formed over the interior surface portion.

7. The method of claim 1, wherein forming the fluorine-comprising material comprises generating a gas plasma from a source gas comprising $NF_3$, the gas plasma being remote from the chemical vapor deposition reactor, the gas plasma having activated fluorine therein, and providing at least some of the activated fluorine from the gas plasma over the interior surface portion.

8. The method of claim 1, wherein chemical vapor depositing a dielectric layer comprises depositing a dielectric layer comprising tantalum pentoxide.

9. A method of forming a dielectric layer comprising:
treating an internal surface of a chemical vapor deposition reactor with a gas plasma generated from a source gas comprising $NF_3$ sufficient to leave some residual fluorine thereover; and
exposing an interior of the reactor to chemical vapor depositing conditions effective to form a dielectric layer comprising fluorine from the residual fluorine.

10. The method of claim 9, wherein at least some of the residual fluorine comprises activated fluorine.

11. The method of claim 9, wherein at least some of the residual fluorine comprises activated fluorine which is present during the chemical vapor depositing of the dielectric layer.

12. The method of claim 9, wherein exposing an interior of the reactor comprises doing so in the absence of the gas plasma.

13. The method of claim 9, wherein exposing an interior of the reactor comprises exposing a substrate within the reactor to chemical vapor depositing conditions effective to form the dielectric layer thereover to comprise a material having a dielectric constant greater than about six.

14. The method of claim 9, wherein exposing an interior of the reactor comprises exposing a substrate within the reactor to chemical vapor depositing conditions effective to form the dielectric layer thereover to comprise tantalum pentoxide.

15. The method of claim 9, wherein exposing an interior of the reactor comprises exposing a substrate within the reactor to chemical vapor depositing conditions effective to form the dielectric layer thereover to comprise less than about 10% by weight of fluorine.

16. The method of claim 9, wherein exposing an interior of the reactor comprises exposing a substrate within the reactor to chemical vapor depositing conditions effective to form the dielectric layer thereover to comprise between about 0.001% and 10% by weight of fluorine.

17. A method of forming a capacitor comprising:
treating an internal surface of a chemical vapor deposition reactor with a gas plasma generated from a source gas comprising fluorine sufficient to leave some residual activated fluorine thereover;
after said treating, placing a first capacitor plate layer within the chemical vapor deposition reactor; and
chemical vapor depositing a dielectric layer over the first capacitor plate layer comprising at least some fluorine from the activated fluorine over the substrate.

18. The method of claim 17, further comprising forming a second capacitor plate layer over the dielectric layer.

19. The method of claim 17, wherein treating an internal surface comprises forming a gas plasma from a fluorine-comprising source, the gas plasma having at least some activated fluorine therein which is provided within the reactor.

20. The method of claim 19, wherein the gas plasma is formed away from a substrate having the first capacitor plate formed thereon.

21. The method of claim 17, wherein treating an internal surface comprises:
providing a remote plasma source operably coupled with the reactor;
in the remote plasma source, generating the gas plasma from a fluorine-comprising source gas, the plasma including activated fluorine; and
flowing activated fluorine from the gas plasma into the reactor.

22. The method of claim 21, wherein a substrate having the first capacitor plate formed thereon is not exposed to the gas plasma.

23. The method of claim 21, wherein the reactor is substantially plasma-free during the depositing of the dielectric layer.

24. The method of claim 21, wherein depositing the dielectric layer comprises depositing the dielectric layer when the reactor is plasma-free.

25. The method of claim 21, wherein generating a gas plasma comprises generating a gas plasma from a gas comprising $NF_3$.

26. The method of claim 17, wherein the dielectric layer comprises material having a dielectric constant greater than about six.

27. A method of forming a dielectric layer in a chemical vapor deposition reactor comprising:
generating a fluorine-comprising gas plasma having activated fluorine therein;
disposing some of the activated fluorine over at least a surface portion of an interior of the reactor; and
chemical vapor depositing a dielectric layer within the reactor and dislodging at least some of the activated fluorine from the surface portion to incorporate at least some fluorine of the activated fluorine in the dielectric layer.

28. The method of claim 27, wherein generating a fluorine-comprising gas plasma comprises generating a fluorine-comprising gas plasma remote from the chemical vapor deposition reactor, the gas plasma having activated fluorine therein, and providing at least some of the activated fluorine from the gas plasma over the surface portion.

29. The method of claim 27, wherein the dielectric layer comprises tantalum pentoxide.

30. A method of forming a dielectric layer using a chemical vapor deposition reactor comprising:
generating a fluorine-comprising gas plasma having activated fluorine therein;
disposing some of the activated fluorine over at least a surface portion of an interior of the reactor; and
chemical vapor depositing a dielectric layer comprising tantalum pentoxide within the reactor and dislodging at least some of the activated fluorine from the surface portion to incorporate at least some fluorine of the activated fluorine in the dielectric layer.

31. The method of claim 30, further comprising, after disposing, introducing a substrate into the reactor, wherein chemical vapor depositing comprises chemical vapor depositing the dielectric layer on the substrate.

32. A method of forming a dielectric layer comprising:
providing a chemical vapor deposition reactor having an internal surface;
treating the internal surface with a gas plasma generated from a source gas comprising $NF_3$ sufficient to leave some residual activated fluorine thereover; and
after said treating, exposing an interior of the reactor to chemical vapor depositing conditions in the absence of the gas plasma effective to form a dielectric layer comprising fluorine from the residual fluorine, wherein at least some of the residual fluorine comprises activated fluorine which is present during the chemical vapor depositing of the dielectric layer and wherein the dielectric layer comprises between about 0.001% and 10% by weight of fluorine.

33. The method of claim 32, wherein the dielectric layer comprises a material having a dielectric constant greater than about six.

34. The method of claim 32, wherein the dielectric layer comprises tantalum pentoxide.

35. The method of claim 32, further comprising, prior to exposing, placing a substrate within the reactor, wherein exposing comprises exposing the substrate to chemical vapor depositing conditions in the absence of the gas plasma effective to form a dielectric layer on the substrate comprising fluorine from the residual fluorine.

* * * * *